(12) United States Patent
Shinoda et al.

(10) Patent No.: US 10,418,254 B2
(45) Date of Patent: Sep. 17, 2019

(54) ETCHING METHOD AND ETCHING APPARATUS

(71) Applicant: HITACHI HIGH-TECHNOLOGIES CORPORATION, Minato-ku, Tokyo (JP)

(72) Inventors: Kazunori Shinoda, Tokyo (JP); Naoyuki Kofuji, Tokyo (JP); Hiroyuki Kobayashi, Tokyo (JP); Nobuya Miyoshi, Tokyo (JP); Kohei Kawamura, Tokyo (JP); Masaru Izawa, Tokyo (JP); Kenji Ishikawa, Nagoya (JP); Masaru Hori, Nagoya (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/906,862

(22) Filed: Feb. 27, 2018

(65) Prior Publication Data

US 2019/0067032 A1 Feb. 28, 2019

(30) Foreign Application Priority Data

Aug. 23, 2017 (JP) .................................. 2017-159969

(51) Int. Cl.
*H01L 21/67* (2006.01)
*H01L 21/3213* (2006.01)
(Continued)

(52) U.S. Cl.
CPC ........ *H01L 21/32138* (2013.01); *H01J 37/00* (2013.01); *H01L 21/67017* (2013.01);
(Continued)

(58) Field of Classification Search
CPC ... H04W 48/10; H04W 48/14; H04W 72/005; H04W 72/0446; H04W 72/0453;
(Continued)

(56) References Cited

U.S. PATENT DOCUMENTS 5,195,045 A 3/1993 Keane et al.
5,712,592 A 1/1998 Stimson et al.
(Continued)

FOREIGN PATENT DOCUMENTS

JP 11-185998 A 7/1999
JP 2001-185542 A 7/2001
(Continued)

OTHER PUBLICATIONS

Patrick Verdonck et al.; "Analysis of the Etching Mechanisms of Tungsten in Fluorine Containing Plasmas"; Journal of Electrochemical Society; vol. 142, No. 6, pp. 1971-1976, (Jun. 1995).
(Continued)

*Primary Examiner* — Lan Vinh
(74) *Attorney, Agent, or Firm* — Miles & Stockbridge PC

(57) ABSTRACT

In an etching method of etching a tungsten film, the method is provided to execute a generating a surface reaction layer on a tungsten film that is formed on a surface of a base material by supplying a reactive species including fluorine which is generated in plasma onto the base material for a first predetermined time in a state where the base material of which the tungsten film is formed on at least a portion of the surface is cooled to a melting point temperature or lower of a tungsten fluoride, and a removing the surface reaction layer that is generated on the tungsten film by heating the base material of which the surface reaction layer is generated on the tungsten film to a boiling point temperature or higher of the tungsten fluoride for a second predetermined time.

17 Claims, 8 Drawing Sheets

(51) Int. Cl.
*H01L 27/115* (2017.01)
*H01J 37/00* (2006.01)
*H01L 21/3065* (2006.01)

(52) U.S. Cl.
CPC .. *H01L 21/67069* (2013.01); *H01L 21/67109* (2013.01); *H01L 21/67115* (2013.01); *H01L 27/115* (2013.01); *H01L 21/3065* (2013.01)

(58) Field of Classification Search
CPC .. H04W 72/046; H04W 72/048; Y02D 70/00; Y02D 70/1262; Y02D 70/1264; Y02D 70/1222; H01L 21/3065; H01L 21/32138; H01L 21/67017; H01L 21/67069; H01L 21/67109; H01L 21/67115; H01L 27/115; H01J 37/00
USPC ....... 438/706, 710, 712, 714, 717, 723, 736, 438/758, 719, 722; 156/345.24, 345.27, 156/345.37
See application file for complete search history.

(56) References Cited

U.S. PATENT DOCUMENTS

| | | | |
|---|---|---|---|
| 5,770,922 A | 6/1998 | Gerrish et al. | |
| 6,265,831 B1 | 7/2001 | Howald et al. | |
| 6,270,618 B1 | 8/2001 | Nakano et al. | |
| 6,351,683 B1 | 2/2002 | Johnson et al. | |
| RE38,273 E | 10/2003 | Gerrish et al. | |
| 6,677,711 B2 | 1/2004 | MacGearailt | |
| 6,919,689 B2 | 7/2005 | Jafarian-Tehrani et al. | |
| 7,084,832 B2 | 8/2006 | Pribyl | |
| 7,190,119 B2 | 3/2007 | Patrick et al. | |
| 7,645,357 B2 | 1/2010 | Paterson et al. | |
| 8,038,896 B2 | 10/2011 | Ikegami et al. | |
| 8,546,266 B2 | 10/2013 | Mori et al. | |
| 9,431,268 B2 * | 8/2016 | Lill | C23C 16/458 |
| 9,548,228 B2 * | 1/2017 | Chandrashekar | H01L 21/67207 |
| 9,978,610 B2 * | 5/2018 | Fung | H01L 21/32136 |
| 2001/0022293 A1 | 9/2001 | Maeda et al. | |
| 2004/0185670 A1 | 9/2004 | Hamelin et al. | |
| 2006/0037704 A1 | 2/2006 | Iwata et al. | |
| 2006/0048892 A1 | 3/2006 | Arase et al. | |
| 2007/0044716 A1 | 3/2007 | Tetsuka et al. | |
| 2008/0128087 A1 | 6/2008 | Hayano et al. | |
| 2008/0190893 A1 | 8/2008 | Mori et al. | |
| 2008/0268645 A1 | 10/2008 | Kao et al. | |
| 2008/0277062 A1 | 11/2008 | Koshimizu et al. | |
| 2009/0023296 A1 | 1/2009 | Nishizuka | |
| 2010/0258529 A1 | 10/2010 | Mori et al. | |
| 2011/0297533 A1 | 12/2011 | Mori et al. | |
| 2013/0228550 A1 | 9/2013 | Mori et al. | |
| 2014/0102640 A1 | 4/2014 | Yokogawa et al. | |
| 2014/0225503 A1 | 8/2014 | Mori et al. | |
| 2015/0072533 A1 | 3/2015 | Muraki et al. | |
| 2015/0179464 A1 * | 6/2015 | Wang | H01L 21/32136 438/714 |
| 2015/0262829 A1 | 9/2015 | Park et al. | |
| 2015/0270148 A1 | 9/2015 | Shinoda et al. | |
| 2015/0357210 A1 | 12/2015 | Mori et al. | |
| 2016/0035585 A1 | 2/2016 | Xiang et al. | |

FOREIGN PATENT DOCUMENTS

| | | |
|---|---|---|
| JP | 2002-343768 A | 11/2002 |
| JP | 2003-347278 A | 12/2003 |
| JP | 2006-066905 A | 3/2006 |
| JP | 2007-059567 A | 3/2007 |
| JP | 2008-244146 A | 10/2008 |
| JP | 2011-082180 A | 4/2011 |
| TW | 2008-02592 A | 1/2008 |
| TW | 2006-20454 | 6/2008 |
| TW | 2008-29087 | 7/2008 |
| TW | 2015-33796 A | 9/2015 |

OTHER PUBLICATIONS

Office Action dated Sep. 26, 2018 for TW Application No. 107106284.
Office Action dated Jul. 13, 2018 for KR Application No. 10-2014-0013325 (with Machine translation).
Office Action dated Jul. 13, 2018 for KR Application No. 10-2015-0053111 (with Machine translation).
Office Action dated Aug. 9, 2016 for JP Application No. 2013-112562.
Office Action dated Jan. 15, 2016 for TW Application No. 10520049730.
Office Action dated Jan. 19, 2015 for KR Application No. 10-2014-0013325 (partial translation).
STIC Search Report dated Oct. 7, 2014 for U.S. Appl. No. 14/177,251.

\* cited by examiner

ETCHING METHOD AND ETCHING APPARATUS

CLAIM OF PRIORITY

The present application claims priority from Japanese Patent Application JP 2017-159969 filed on Aug. 23, 2017, the content of which is hereby incorporated by reference into this application.

BACKGROUND OF THE INVENTION

Field of the Invention

The present invention relates to an etching method and an etching apparatus of a tungsten film.

Background Art

High integration of a semiconductor device, which is drawn by spread of a mobile device which is represented by a smartphone, is developed. In the field of a recording semiconductor, a three-dimensional (3D) NAND flash memory which is obtained by multilayeredly stacking memory cells in a three-dimensional direction is mass-produced, and the number of stacking memory layers is currently 64 layers. In the field of a logic semiconductor, a fin-type field effect transistor (FET) having a three-dimensional structure becomes a mainstream. A gate length of the FET is steadily shortened, and advent of an era of the gate length which is less than a 10 nm generation is expected.

In this manner, three-dimensional making of an element structure, and reduction of a processing dimension progress, accordingly, a need for an etching technology having both isotropy and high processing dimension controllability in an atomic layer level is increased, in a device manufacturing process.

In the related art, as an isotropic etching technology, a wet etching technology such as etching of a silicon dioxide using a mixed aqueous solution of hydrofluoric acid and ammonium fluoride, etching of a silicon nitride using heat phosphoric acid, or etching of tungsten using a liquid mixture of hydrofluoric acid and nitric acid has been widely used. However, in the wet etching technology of the related art using a wet chemical solution, there is a problem that pattern collapse due to surface tension of a rinse liquid becomes apparent, in accordance with the shrinkage of a pattern.

For example, in a case where a high aspect ratio pattern of silicon is used, when a pattern interval is narrowed, it is reported that a limit value of the pattern interval in which the collapse begins due to the surface tension at the time of drying the rinse liquid becomes large in proportion to a square of the aspect ratio. Therefore, it is strongly desired to develop a process method of isotropically etching various films without using the wet chemical solution.

Tungsten is a material that is widely used in a semiconductor device manufacturing process, as a material for an electrode or wiring. Therefore, in the next generation semiconductor device manufacturing process, there is a need for the tungsten etching technology having all of isotropy, high processing dimension controllability in the atomic layer level, and high selectivity.

In the related art, as an isotropic tungsten etching technology in which the wet chemical solution is not used, a method of isotropically etching tungsten at an etching speed exceeding 160 nm/minute by supplying a fluorine radical using plasma of $NF_3/O_2$, is published in Journal of Electrochemical Society, vol. 142, No. 6, 1971 (1995) written by Patrick Verdonck, Jacobus Swart, Guy Brasseur, and Pascal De Geyter.

SUMMARY OF THE INVENTION

Hereafter, for example, in a process of a gate electrode of the next generation 3D NAND flash memory, it is considered that there is a need for a technology of isotropically etching a tungsten film with controllability in an atomic layer level, by a process of being electrically separated by transversely etching tungsten which is embedded in a fine groove of a high aspect ratio.

Therefore, for example, the inventors or the like study a case where the plasma etching technology that is published in Journal of Electrochemical Society, vol. 142, No. 6, 1971 (1995) written by Patrick Verdonck, Jacobus Swart, Guy Brasseur, and Pascal De Geyter is applied to a structure body, as an example. A result thereof is illustrated in FIG. 8. FIG. 8 is a schematic diagram illustrating a change of a wafer sectional structure in a case where plasma etching of the related art is used. A wafer cross section 810 illustrates a state (S801) where a groove pattern 811 of a high aspect ratio is formed in a multilayered film of a tungsten film 321 and a silicon dioxide film 371 which are formed on an inside of a groove pattern 331 of a polycrystalline silicon film 330, a wafer cross section 820 illustrates a state (S802) where the tungsten film 321 is removed as a reaction product 281 by supplying a radical (reactive species) 223 containing fluorine in order to etch the tungsten film 321, and a wafer cross section 830 illustrates a state (S803) where the etching of the tungsten film 321 is stopped. The polycrystalline silicon film 330 is formed on the silicon dioxide film 371, and the silicon dioxide film 371 is formed on a surface of the polycrystalline silicon film 330.

As illustrated in the wafer cross section 820 of FIG. 8, in a case where only the tungsten film 321 is transversely etched on the inside of the groove pattern 331 of the high aspect ratio in which the tungsten film 321 and the silicon dioxide film 371 are alternately stacked, in order to continuously advance the etching at a room temperature without controlling the temperature, a nonvolatile surface reaction layer is not formed on the surface of the tungsten film 321, and the etching continuously progresses, by continuous desorption of the reaction product 281.

In this case, the reactive species 223 is consumed in the vicinity of an opening portion of the groove pattern 331, thereby, the amount of the reactive species 223 which reaches up to a deep region in a lower portion of the groove pattern 331 becomes small. Therefore, distribution of an etching amount becomes non-uniform by reflecting the distribution of the reactive species 223, and the etching amount becomes large in the vicinity of the opening portion of the groove pattern 331, and becomes small in the deep region of the groove pattern 331. As a result, in the continuous etching technology of the related art, it is considered that the large distribution of the etching amount occurs in a depth direction of the groove pattern 331, and an element yield relating to the processing dimension controllability of the etching amount is lowered.

In the tungsten isotropic etching technology of the related art, for example, the etching of tungsten continuously progresses at the etching speed exceeding 160 nm/minute, and the etching amount is controlled by plasma treatment time. Therefore, it is difficult to control the etching amount with high processing dimension controllability in the atomic layer level.

In this manner, in the continuous plasma etching technology of the related art, the etching amount becomes non-uniform by reflecting the distribution of the radicals, the uniformity of the etching amount is low in a wafer in-plane direction and a pattern depth direction, and the etching amount ought to be controlled by the plasma treatment time. Therefore, it is considered that application of the continuous plasma etching technology of the related art is limited in the device manufacturing process of the next generation and the subsequent generations in which high processing dimension controllability in the atomic layer level is demanded.

An object of the invention is to provide an etching method and an etching apparatus of a tungsten film which are capable of controlling an etching amount with high processing dimension controllability in an atomic layer level, and have high uniformity of the etching amount in a wafer in-plane direction and a pattern depth direction. The object and new features of the invention will be clear from description and accompanying drawings of the specification herein.

In order to solve the problems described above, according to an aspect of the invention, there is provided an etching method of etching a tungsten film which is formed on at least a portion of a surface of a base material, the method including generating a surface reaction layer of the tungsten film on a surface of the tungsten film by supplying a reactive species including fluorine which is generated in plasma onto the surface of the tungsten film for a first predetermined time in a state in which the base material and the tungsten film are maintained at a temperature that is lower than a melting point temperature of a tungsten fluoride; and removing the surface reaction layer that is generated on the surface of the tungsten film by heating the surface reaction layer to a boiling point temperature or higher of the tungsten fluoride for a second predetermined time.

In order to solve the problems described above, according to another aspect of the invention, there is provided an etching method of etching a tungsten film which is formed on a surface of a base material, the method including generating a tungsten hexafluoride layer on a surface of the tungsten film by supplying a reactive species including fluorine that is generated in plasma to the surface of the tungsten film, the tungsten hexafluoride layer having a self-limiting nature; and removing the tungsten hexafluoride layer by heating a surface of the tungsten hexafluoride layer to a boiling point temperature or higher of the tungsten hexafluoride layer.

In order to solve the problems described above, according to still another aspect of the invention, there is provided an etching apparatus which etches a tungsten film, including a treatment chamber, a stage unit which is disposed in an inside of the treatment chamber and on which a treated body is placed, a cooling unit for cooling the stage unit, a gas supply unit that supplies a gas including fluorine to the inside of the treatment chamber, a plasma source that excites the gas supplied from the gas supply unit to generate plasma, and supplies a radical including fluorine to the inside of the treatment chamber, a vacuum exhaust system that evacuates gas from the inside of the treatment chamber, a heating unit that heats the treated body placed on the stage unit, and a controller that controls the cooling unit, the gas supply unit, the plasma source, the vacuum exhaust system, and the heating unit, in which the controller executes first treatment in a first predetermined time in which a surface reaction layer of the tungsten film is generated on a surface of the tungsten film by supplying the gas including the fluorine to the plasma source from the gas supply unit, exciting the supplied gas to generate the plasma, and supplying the radical including the fluorine to the inside of the treatment chamber, in a state in which the stage unit is cooled by the cooling unit, by controlling the cooling unit, the gas supply unit, and the plasma source, and a second predetermined time in which the surface reaction layer that is generated on the surface of the tungsten film in the first treatment is heated by the heating unit and removed while the air of the inside of the treatment chamber is evacuated by the vacuum exhaust system, by controlling the vacuum exhaust system and the heating unit.

If an effect that is representatively obtained by the invention disclosed in the specification herein is simply described, the effect is as follows. According to the invention, it is possible to provide a technology (isotropic atomic layer level etching technology of the tungsten film) of etching the tungsten film with high uniformity in the wafer in-plane direction and the pattern depth direction, and high processing dimension controllability in the atomic layer level.

DETAILED DESCRIPTION OF THE INVENTION

Figure 1:
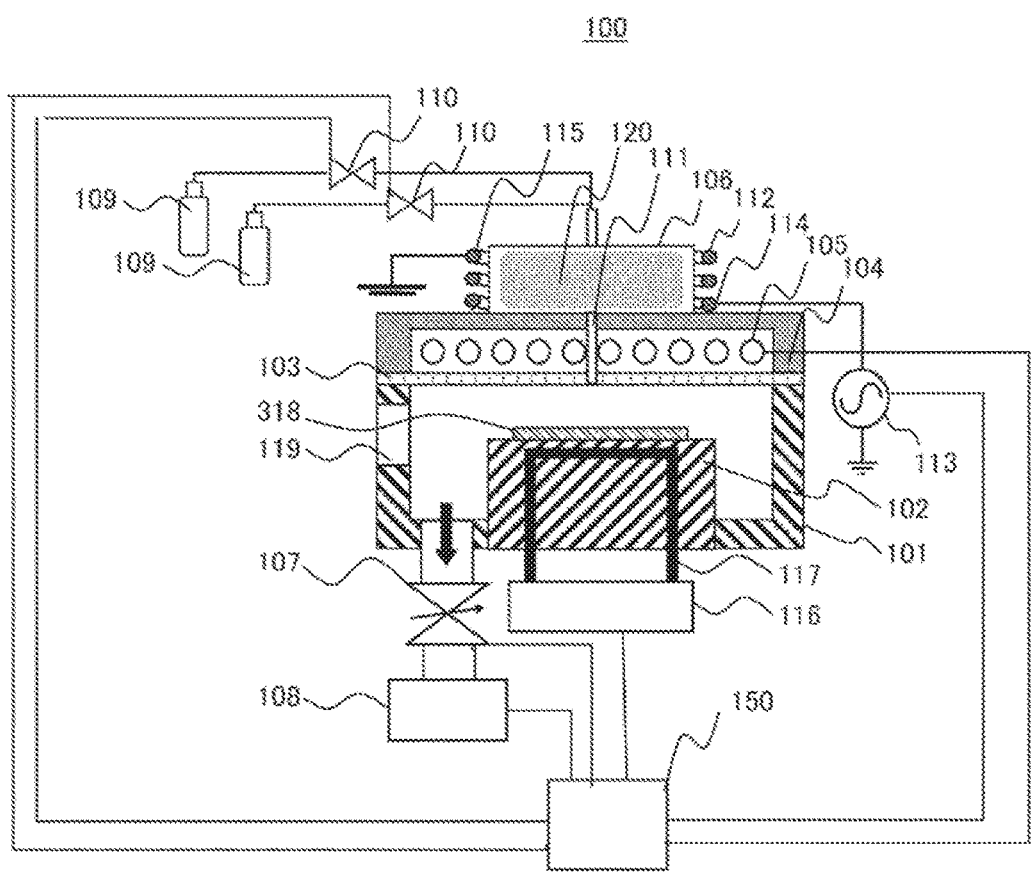
FIG. 1 is a sectional view illustrating a schematic configuration of an etching apparatus according to a first embodiment of the invention.

The inventors try etching of tungsten using various gases. As a result, it is found out that (1) a nonvolatile film (surface reaction layer) is formed on a surface of a tungsten film, by supplying a reactive species containing fluorine which is generated in plasma to the tungsten film in a state of maintaining a base material at a melting point temperature or lower of a tungsten fluoride, (2) a generation amount of the surface reaction layer has self-limiting nature, and (3) the surface reaction layer is removed by heating.

The invention is made based on the new finding. Specifically, the forming of the surface reaction layer by supplying the reactive species containing fluorine to the surface of tungsten, and the removing of the surface reaction layer by the heating are performed, and the forming and the removing are repeated, thereby, it is possible to etch tungsten by only a desired amount.

According to an etching technology of the invention, since a treatment having the self-limiting nature is performed, uniformity becomes large in an etching amount of a wafer in-plane direction and a pattern depth direction. Since a film thickness of tungsten which is removed by a cycle of one time has a fixed thickness in an atomic layer level, and the total etching amount is determined by the number of repeated cycle treatments, it is possible to control the etching amount with accuracy and precision of a processing dimension in the atomic layer level. That is, an atomic layer level etching of tungsten is realized.

Here, an etching method that is configured with cyclic repetition of a forming process and a removing process of the surface reaction layer in which each process has the self-limiting nature, is referred to as an atomic layer level etching. A word referred to as an "atomic layer" is used in the term, but the term is not limited to the atomic layer etching in a narrow sense such that the etching amount per cycle is one atomic layer, and the term is used as long as each process has self-limiting nature with respect to treatment time or the like even if the etching amount per cycle is an order of nanometer. At the time of expressing the same meaning, other terms such as "digital etching", "self-limited cycle etching", and "atomic layer etching" may be used in some cases.

Hereinafter, the invention will be described in detail by embodiments with reference to the drawings. In all the drawings for describing the embodiments, the same mark is attached to a portion having the same function, and the repeated description thereof will be omitted. Hereinafter, in the drawings for describing the embodiments, there is a case that hatching is attached even in a plan view in order to easily understand a configuration.

First Embodiment

A first embodiment will be described with reference to FIGS. 1 to 7. The first embodiment is an example of isotropically performing the atomic layer level etching of the tungsten film on a silicon wafer, using the reactive species which is generated in the plasma of a $SF_6/O_2$ gas.

FIG. 1 is a sectional view schematically illustrating a configuration of an etching apparatus 100 according to the first embodiment. The etching apparatus 100 includes a wafer stage 102 that is disposed on an inside of a treatment chamber 101, a lamp unit 104 that is disposed in an upper portion of the treatment chamber 101 by interposing a quartz glass 103 therebetween, an infrared lamp 105 that is included within the lamp unit 104, a plasma source 106 that is disposed in the upper portion of the lamp unit 104, and a controller 150.

The treatment chamber 101, the quartz glass 103, and the lamp unit 104 are configured to have an airtight structure by a vacuum sealing unit such as an O ring which is not illustrated in the drawing, and the air thereof is exhausted by a vacuum pump 108 which is connected through a variable conductance valve 107. The variable conductance valve 107 and the vacuum pump 108 are controlled by the controller 150.

The etching apparatus 100 is provided with a gas supply unit including a gas cylinder 109 and a valve 110, and the gas which is supplied from the gas cylinder 109 is introduced into the plasma source 106 through the valve 110. The gas supply unit including the gas cylinder 109 and the valve 110 is controlled by the controller 150. The gas which is introduced into the plasma source 106 is activated by the plasma source 106 to generate a radical, and various reactive species including the generated radicals are supplied to the treatment chamber 101 through a gas introduction pipe 111.

The plasma source 106 includes a coil-shaped antenna 112, and an output of a high frequency power source 113 is connected to an electric supply point 114, and is grounded by a grounding point 115. The high frequency power source 113 is controlled by the controller 150.

The wafer stage 102 is cooled by causing a refrigerant to flow through a cooling line 117 with a circulator 116. The circulator 116 is controlled by the controller 150. Although not illustrated, in order to efficiently cool a wafer 318, a mechanism that supplies a helium gas is disposed between a rear surface of the wafer 318 and the wafer stage 102.

A material of the treatment chamber 101 is desirably a material which is excellent in plasma tolerance, and is less likely to generate heavy metal contamination or contamination due to a foreign material in the wafer. For example, aluminum or the like of which anodizing treatment is performed onto the surface is desirable. Alternatively, a material that is obtained by thermally spraying a material such as yttria, alumina, or silicon dioxide to a base material of aluminum may be used.

It is possible to retain a pressure of the treatment chamber 101 to be fixed, in a state where a raw gas of a desired flow rate which is controlled by the controller 150 flows by the variable conductance valve 107 and the vacuum pump 108 that are connected to the treatment chamber 101. The material of the wafer stage 102 is desirably aluminum or the like of which the anodizing treatment is performed onto the surface.

In the upper portion of the treatment chamber 101, there is provided the quartz glass 103 that is mounted to retain an airtight state with the treatment chamber 101 by the vacuum sealing unit such as the O ring which is not illustrated in the drawing. It is desirable to use a material of which transmittance of light is high as a quartz glass 103. For example, it is desirable to use ultra-high purity melting quartz glass or the like which is melted by oxyhydrogen flame using a raw material of high purity. The gas introduction pipe 111 as a rectification unit is connected to the quartz glass 103, and it is possible to supply the reactive species which is activated by the plasma source 106 to the treatment chamber 101.

A shape of the rectification unit is appropriately selected for the purpose of changing a supply form of the radical to the treatment chamber 101. For example, if a disk-shaped shower plate or a donut-shaped introduction pipe is used, it is possible to introduce the radical into the treatment chamber 101 with high uniformity. At that time, as a material of the rectification unit, a material which is high in plasma tolerance, and is less likely to be the foreign material or the contamination, that is, a melting quartz or an yttria sintered body is desirable.

In the upper portion of the quartz glass 103, there is provided the lamp unit 104 including the infrared lamp 105 for heating the wafer. As an infrared lamp 105, it is possible to use a halogen lamp or the like. In the first embodiment, an example in which the infrared lamp is used as a wafer heating unit is illustrated, but other heating units may be used such that a resistance heating heater is used.

A frequency of the high frequency power source 113 which is connected to the plasma source 106 is appropriately selected between 400 kHz and 40 MHz, but 13.56 MHz is used in the first embodiment. The high frequency power source 113 has a frequency matching function which is not illustrated in the drawing. That is, the high frequency power source 113 has the functions that is capable of changing an output frequency in a range which is from ±5% to ±10% with respect to a center frequency of 13.56 MHz, and is capable of feedback controlling the frequency such that a ratio $P_r/P_f$ of a free-travelling wave electric power $P_f$ and a reflected wave electric power $P_r$ which are monitored in an output portion of the high frequency power source 113 becomes small.

As a sort of the gas which is supplied to the plasma source 106, a gas containing fluorine, or a mixed gas obtained by diluting the gas containing fluorine with other gases is used, in order to supply the reactive species containing fluorine to the wafer. More preferably, a gas including oxygen or sulfur is used. The gas including oxygen is used, thereby, there is an effect of increasing a supply amount of a fluorine radical. Since W—W bonding in the tungsten film is weakened by bonding oxygen or sulfur to the surface of tungsten, a W atom is likely to be bonded to a plurality of atoms of fluorine, and there is an effect of promoting the generation of a tungsten hexafluoride, in comparison with a case where there is no oxygen or sulfur in the reactive species.

As an example of the gas containing fluorine, HF, $NF_3$, $CF_4$, $CHF_3$, $CH_2F_2$, $CH_3F$, $C_2F_6$, $C_4F_8$, $SF_6$, or the like may be used. As an example of the gas containing oxygen, $O_2$, $H_2O$, $CO_2$, NO, $NO_2$, or the like may be used. As an example of the gas containing sulfur, $SF_6$, $H_2S$, $SO_2$, or the like may be used. It is possible to use a gas which is appropriately diluted by adding other gases such as Ar, He, $N_2$, and the like to the gas.

As an example of a specific combination, $SF_6$, $SF_6/O_2$, $CF_4/O_2/Ar$, $CHF_3/O_2$, $CH_2F_2/O_2/Ar$, $CH_2F_2/N_2$, $NF_3/NO$, or the like may be used. In the first embodiment, $SF_6/O_2$ is used, but other combinations may be used.

Figure 2:
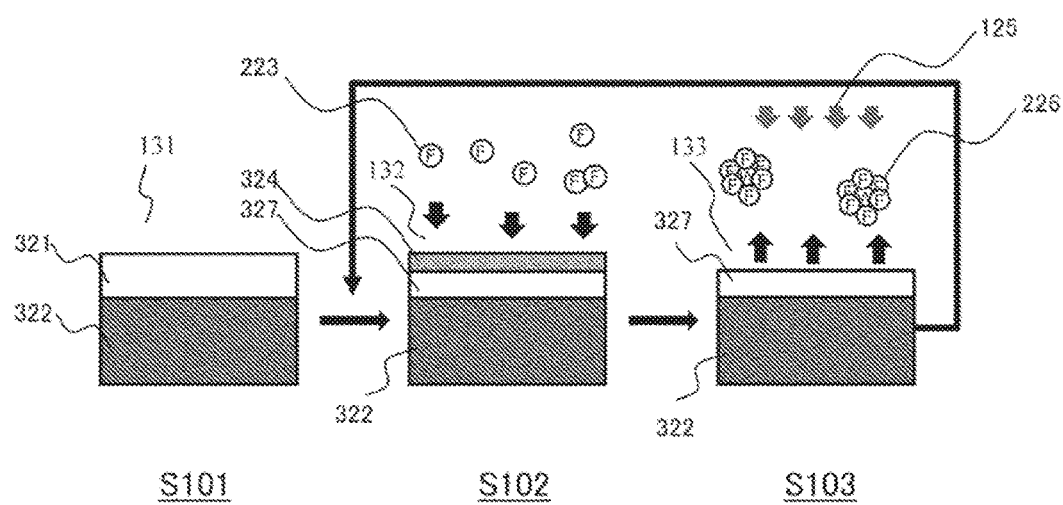
FIG. 2 is a schematic element sectional view illustrating an example of a treatment procedure of an etching method according to the first embodiment of the invention.

A schematic diagram illustrated in FIG. 2, illustrates a treatment procedure of an etching method of the tungsten film according to the first embodiment, and illustrates a change of a sectional structure of the wafer in each process of the etching. The treatment procedure is controlled by the controller 150.

In the first embodiment, first, a film forming apparatus (such as a sputtering apparatus or a vapor deposition apparatus) which is not illustrated in the drawing is used, and a tungsten film 321 is formed on a silicon layer (silicon base substance) 322, as illustrated in a cross section 131 of a sample (step S101).

Next, the sample (silicon base substance) 322 on which the tungsten film 321 is formed is placed on the wafer stage 102 on the inside of the etching apparatus 100 as illustrated in FIG. 1. In this state, the refrigerant is caused to flow through the cooling line 117 by the circulator 116 which is controlled by the controller 150. As illustrated in a cross section 132 of the sample, in a state of maintaining the temperature of the silicon base substance 322 at 2° C. or lower which is lower than the melting point temperature of the tungsten fluoride, the reactive species 223 including the radical of fluorine, which is generated in the plasma source 106, is supplied to the inside of the treatment chamber 101, and chemically reacts with the surface of the tungsten film 321, thereby, a surface reaction layer 324 of which a main ingredient is a tungsten hexafluoride is formed (step S102, first process).

After the surface reaction layer 324 is formed on the surface of the tungsten film 321 for a predetermined time, the control is performed by the controller 150, thereby, the output of the high frequency power source 113 is in an OFF state, the generation of the plasma by the plasma source 106 is stopped, and the step S102 is finished.

Next, the control is performed by the controller 150, thereby, the infrared lamp 105 is turned on. The sample is irradiated with an infrared ray 125 by the infrared lamp 105 which is turned on, thereby, the surface reaction layer 324 is heated to 17° C. or higher which is substantially the same as a boiling point temperature of a tungsten hexafluoride 226. Thereby, as illustrated in a cross section 133 of the sample, the tungsten hexafluoride 226 is removed from the surface of the tungsten film 327 by volatilizing the tungsten hexafluoride 226 which is the main ingredient of the surface reaction layer 324, from the surface reaction layer 324 that is overheated by the irradiation with the infrared ray 125 (step S103, second process).

After the removing of the tungsten hexafluoride 226 from the surface of the tungsten film 327 by volatilizing the tungsten hexafluoride 226 is continued for a predetermined time, the control is performed by the controller 150, thereby, the infrared lamp 105 is turned off, and the step S103 is finished.

The combination of the first process of forming the surface reaction layer 324 and the second process of removing the surface reaction layer 324 is made as one cycle, and the etching is performed by repeating the cycles by the number of times of a case where the total etching amount becomes a target value.

Figure 3:
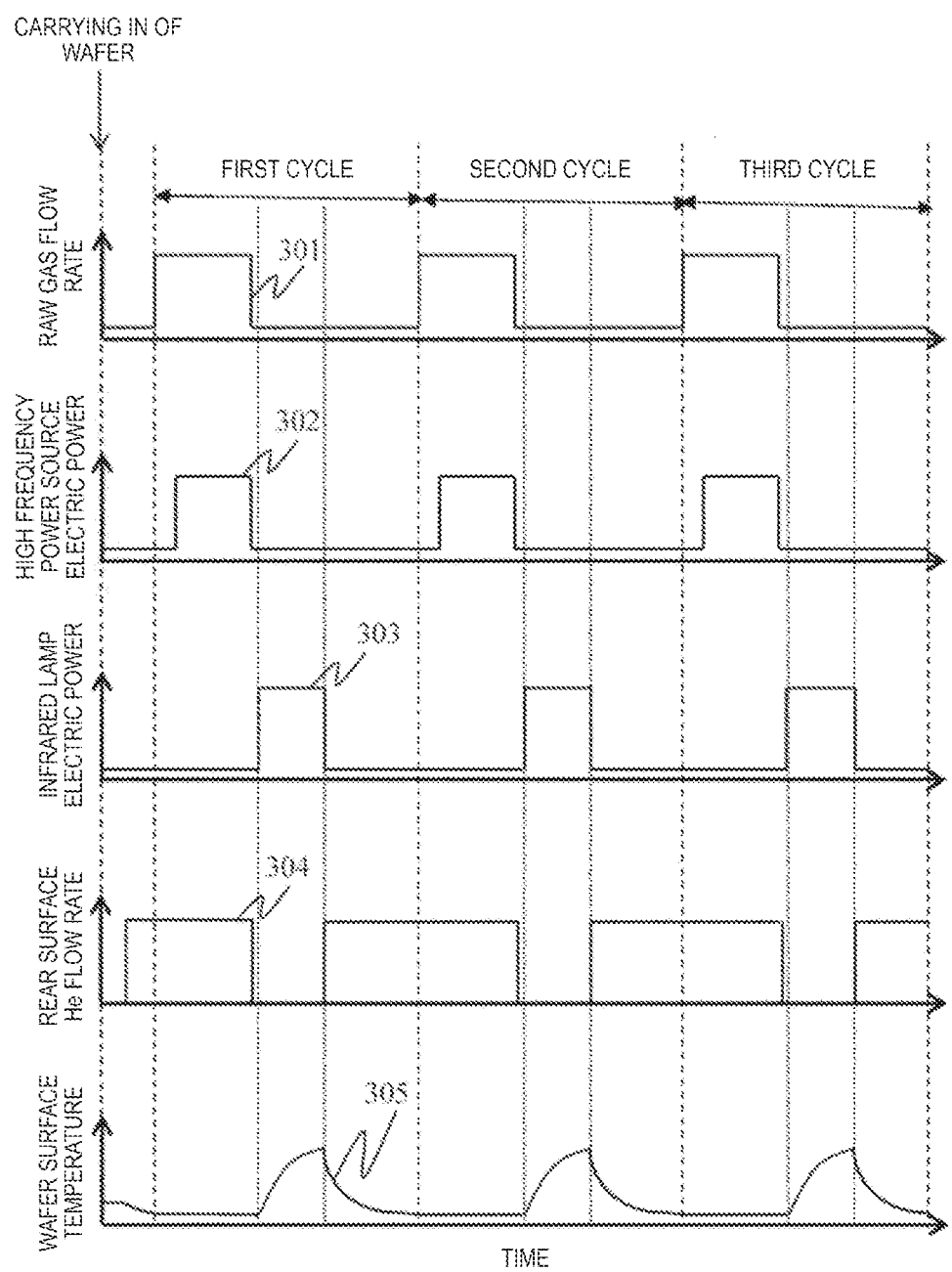
FIG. 3 is a schematic diagram illustrating an example of a time change of a parameter in the etching apparatus according to the first embodiment of the invention, and illustrates a raw gas flow rate, high frequency power source electric power, infrared lamp electric power, a rear surface He flow rate, and a wafer surface temperature in sequence from an upper stage.

A schematic diagram illustrated in FIG. 3 illustrates a procedure in the etching method of the tungsten film according to the first embodiment, and illustrates a change of a parameter of the apparatus in each process of the etching. Here, a time change from a first cycle up to a third cycle at the time of the cycle etching is illustrated in a raw gas flow rate 301 that is supplied to the treatment chamber 101 through the gas introduction pipe 111 from the gas supply unit, a high frequency power source electric power 302 that is applied to the plasma source 106 from the high frequency power source 113, an electric power 303 that is applied to the infrared lamp 105, a He flow rate 304 that flows between the rear surface of the wafer 318 and the wafer stage 102 by a unit which is not illustrated in the drawing, and a wafer surface temperature 305. The values are controlled by the controller 150. Hereinafter, the cycle etching of the tungsten film according to the first embodiment will be described in detail with reference to FIGS. 1 to 3.

First, the wafer 318 on which the tungsten film to be etched is formed, is carried in by a wafer transport apparatus which is not illustrated in the drawing from a wafer transport port 119, and is placed on the wafer stage 102. At this time, the temperature of the wafer stage 102 is controlled to −20° C. by causing the refrigerant to flow through the cooling line 117 with the circulator 116, and the temperature of the wafer 318 which is placed on the wafer stage 102 is cooled to −20° C. Thereafter, the air of the inside of the treatment chamber 101 is exhausted through the variable conductance valve 107 by the vacuum pump 108, in a state where the wafer transport port 119 is closed by a door which is not illustrated in the drawing and the treatment chamber 101 is airtightly maintained.

On the other hand, in the plasma source 106, the $SF_6/O_2$ gas is supplied from the gas supply unit, the high frequency electric power from the high frequency power source 113 is supplied to the coil-shaped antenna 112, and a plasma 120 is formed. At this time, the flow rate of the $SF_6$ gas is 50 sccm, and the flow rate of the $O_2$ gas is 5 sccm.

A source gas which is configured with the $SF_6/O_2$ gas becomes the reactive species 223 including the fluorine radical or the like, which is activated by the plasma 120 that is generated on the inside of the plasma source 106, and the reactive species 223 flows into the treatment chamber 101 from the gas introduction pipe 111. The reactive species 223 including fluorine, which flows into the treatment chamber 101, uniformly diffuses into the whole of the inside of the treatment chamber 101, and a portion thereof is adsorbed onto the entire surface of the wafer 318 that is cooled by being placed on the wafer stage 102 which is cooled up to −20° C.

The reactive species 223 which is adsorbed onto the cooled wafer 318 reacts with the tungsten film 321 on the surface of the wafer 318, and the surface reaction layer 324 is formed. The surface reaction layer 324 is a reaction product in which fluorine-tungsten bonding is included as a main body. In a case where the surface reaction layer 324 is measured by an X-ray photoelectron spectroscopy using a Kα ray of aluminum, there is a large feature that binding energy of a fluorine is spectrum has a peak in the vicinity of 687±2 eV.

Figure 4:
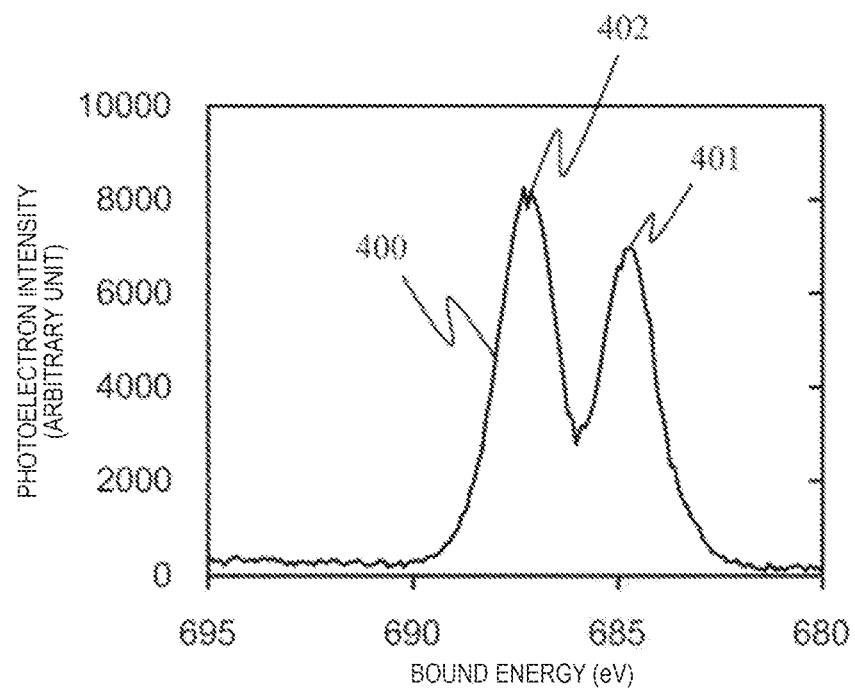
FIG. 4 is a graph illustrating a photoelectron spectrum of a fluorine is in a case where a surface reaction layer which is formed when a reactive species (radical) containing fluorine is supplied to a tungsten film, in a state of maintaining a base material at a melting point temperature or lower of a tungsten fluoride, is analyzed by an X-ray photoelectron spectroscopy using a Kα ray, in the etching method according to the first embodiment of the invention.

FIG. 4 is a photoelectron spectrum 400 of the fluorine is in a case where the tungsten film 321 on which the surface reaction layer 324 is formed is analyzed by the X-ray photoelectron spectroscopy using the Kα ray of aluminum. A peak 402 indicating presence of the tungsten hexafluoride is observed in the vicinity of the binding energy 687±2 eV, in addition to a peak 401 that is observed in the vicinity of a binding energy 684±2 eV due to the bonding of a tungsten tetrafluoride or the like. A case where the peak 402 becomes the main body indicates that the surface reaction layer 324 includes the tungsten hexafluoride as a main ingredient.

In $SF_6/O_2$ gas of the first embodiment, it is considered that there is an effect of increasing the supply amount of the fluorine radical by oxidizing $SF_6$ with oxygen due to the effect of adding oxygen to the mixed gas. Since oxygen and sulfur are included in the gas, oxygen and sulfur are bonded to the tungsten surface, the W—W bonding in the tungsten film is weakened, and the W atom is lifted, thereby, the effect of increasing the number of fluorine atoms that are capable of being bonded to the W atom is expected. Therefore, it is conceived that it is possible to efficiently generate the tungsten hexafluoride.

Atypical composition of this surface reaction layer 324 is considered to be ammonium hexafluoride, but it is considered that there is a case where various bonding states of fluorine and tungsten become a mixed state, such as single fluorine or the tungsten tetrafluoride, or a case where some oxygen is included, depending on the composition of the used reactive species or the reaction time. For example, an example of the bonding state including oxygen is $WOF_4$.

For example, even in the photoelectron spectrum 400 illustrated in FIG. 4, the peak 401 is present in the vicinity of 684±2 eV, therefrom, the presence of the tungsten tetrafluoride is suggested. Regarding the peak 402 in the vicinity of the binding energy 687±2 eV, which is considered as a tungsten hexafluoride described above, there is a possibility that the peak 402 is $WOF_4$ if only a peak position is considered.

However, the peak 402 in the vicinity of 687±2 eV, which is observed at this time, disappears by the vacuum heating at 50° C. as described later, therefrom, the peak 402 is considered to be the tungsten hexafluoride, not $WOF_4$. This is because the melting point temperature of $WOF_4$ is 110° C., the boiling point temperature thereof is 188° C., and $WOF_4$ is low in volatility in comparison with the tungsten hexafluoride, thereby, $WOF_4$ is not considered to be volatilized at 50° C.

A value of the binding energy illustrated on a transverse axis of FIG. 4, is a value obtained by correcting the position of a carbon is peak due to surface contamination carbon which is observed on the surface of an initial sample to be 284.5 eV.

Figure 5:
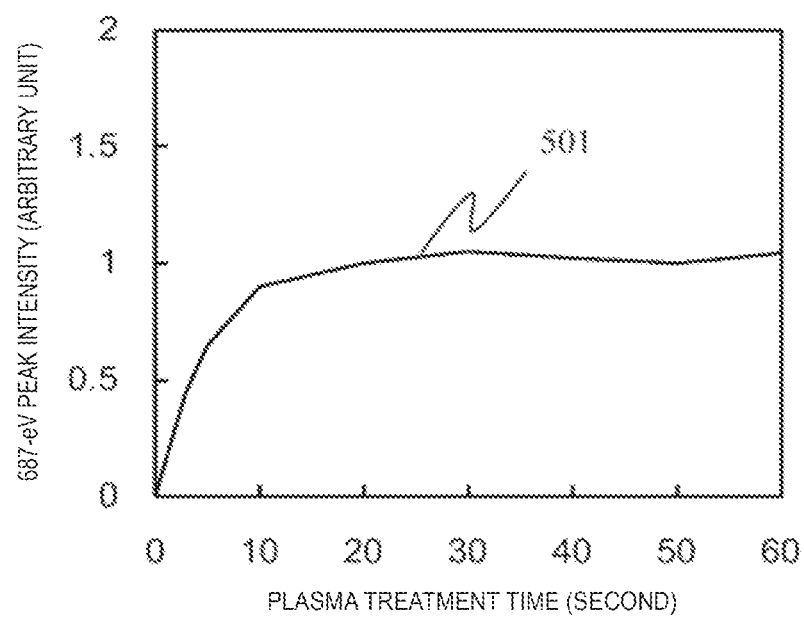
FIG. 5 is a graph illustrating plasma treatment time dependency of 687±2 eV peak intensity in the photoelectron spectrum of the fluorine is that is caused by the surface reaction layer which is formed when the reactive species (radical) containing fluorine is supplied to the tungsten film, in the state of maintaining the base material at the melting point temperature or lower of the tungsten fluoride, in the etching method according to the first embodiment of the invention.

FIG. 5 is a graph 501 illustrating dependency, with respect to plasma treatment time, of peak intensity (which is equivalent to intensity of the peak 402 in FIG. 4) of 687±2 eV that is caused by the surface reaction layer 324. The plasma treatment time indicates the elapsed time from a start of supplying the high frequency electric power to the coil-shaped antenna 112 from the high frequency power source 113. As illustrated in the graph 501 of FIG. 5, the peak intensity of 687±2 eV that is caused by the surface reaction layer 324 increases in accordance with the elapse of the plasma treatment time, and exhibits the self-saturation tendency, and the plasma treatment time becomes substantially fixed at 15 seconds or more.

In this manner, a property that the generation amount of the reaction product has the self-limiting nature is similar to a natural oxidation phenomenon of a metal surface and a silicon surface. In this manner, since there is the self-limiting nature in the forming of the surface reaction layer 324, the plasma treatment of the time which is demanded for the saturation or longer is performed, thereby, it is possible to make the generation amount (film thickness) of the surface reaction layer 324 which is generated per cycle fixed.

In the first embodiment, it takes 15 seconds that the generation amount of the surface reaction layer 324 is saturated, but the time which is taken up to the saturation is changed, in accordance with the apparatus parameter such as a distance between the plasma source 106 and the wafer 318 which is placed on the wafer stage 102, or the temperature of the wafer 318.

After the plasma treatment time which is demanded for saturating the generation of the surface reaction layer 324 is elapsed, the control is performed by the controller 150, thereby, the valve 110 is closed, the supply of the source gas is stopped, and the supply of the high frequency electric power to the plasma source 106 from the high frequency power source 113 is stopped. The gas remaining on the inside of the treatment chamber 101 is exhausted by the vacuum pump 108 through the variable conductance valve 107.

Subsequently, the control is performed by the controller 150, thereby, the infrared lamp 105 is turned on while the air of the inside of the treatment chamber 101 is exhausted in a vacuum by the vacuum pump 108, and the surface of the wafer 318 is heated in a vacuum. At this time, the irradiation time is 5 seconds, a maximum attainment temperature of the wafer surface is 50° C., and the pressure is $1 \times 10^{-3}$ Pa.

The process is a process of volatilizing the tungsten hexafluoride that is the main ingredient of the surface reaction layer 324 which is formed on the surface of the wafer 318. The more the temperature is high and the pressure is low, the more that volatilization reaction is favorable. The inventors find out that setting of the surface temperature of the wafer 318 to be the boiling point temperature or higher of the tungsten hexafluoride, that is, 17° C. or higher is effective, in order to promptly cause the volatilization reaction. It is found out that the setting of the pressure of the inside of the treatment chamber 101 to be 100 Pa or less is effective.

In the first embodiment, the maximum attainment temperature of the wafer surface is 50° C., and a degree of vacuum is $1 \times 10^{-3}$ Pa, but any value may be used as long as the maximum attainment temperature is appropriately set to be a suitable value in a temperature range of the boiling point temperature or higher of the tungsten hexafluoride. The typical temperature range is 25° C. to 100° C. The typical pressure at the time of the heating is $1 \times 10^{-5}$ Pa to 100 Pa.

Figure 6:
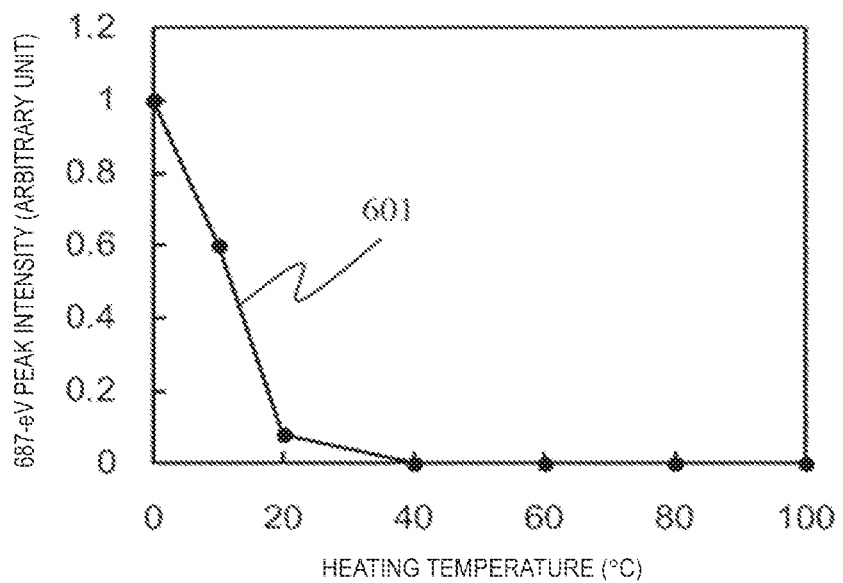
FIG. 6 is a graph illustrating a change of the 687±2 eV peak intensity in the photoelectron spectrum of the fluorine is that is caused by the surface reaction layer, when the surface reaction layer is heated at each temperature for one minute in a vacuum, in the etching method according to the first embodiment of the invention.

FIG. 6 is a graph illustrating a change of a peak intensity 601 (which is equivalent to the intensity of the peak 402 in FIG. 4) of 687±2 eV that is caused by the surface reaction layer 324, in a case where the wafer 318 is heated at various temperatures for one minute, in the degree of vacuum of $1 \times 10^{-3}$ Pa on the inside of the treatment chamber 101. It is understood that the peak intensity 601 of 687±2 eV which is caused by the surface reaction layer 324 is lowered before and after the heating temperature of 10° C., and disappears in a case where the heating is performed at 40° C. By the vacuum heating, it is possible to volatilize the surface reaction layer at a low temperature of 100° C. or lower, which is suitable for application to a semiconductor device manufacturing process. Since it is possible to make the cooling time short if the temperature is set to be 50° C. or lower, the throughput in an etching process is improved. The effect becomes apparent as the number of cycles is large.

Here, the pressure of the inside of the treatment chamber 101 at the time of the heating will be further described. In 100 Pa, the sufficient volatilization is viewed at 50° C., but if the pressure is raised up to 500 Pa, the temperature which is demanded for the prompt volatilization is approximately 80° C. Therefore, considering the effect of shortening the cooling time, the pressure at the time of the vacuum heating is desirably 100 Pa or less. The pressure at the time of the heating is desirable as low as possible, but the pressure at the time of the heating is more desirably 10 Pa or less, and is suitable to be 0.1 Pa or less. However, a lower limit value of the pressure is desirably $1 \times 10^{-5}$ Pa or more, considering a cost increase of an air discharge facility and the long-time making of the air discharge time.

Figure 7:
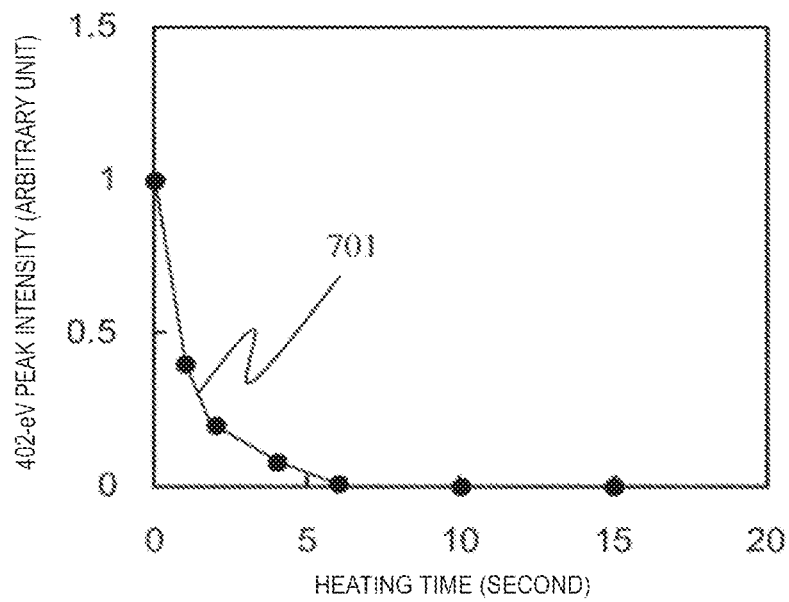
FIG. 7 is a graph illustrating heating time dependency of the 687±2 eV peak intensity in the photoelectron spectrum of the fluorine is that is caused by the surface reaction layer when the surface reaction layer is heated by heating a lamp of which an attainment temperature is 50° C., in the etching method according to the first embodiment of the invention.
Figure 8:
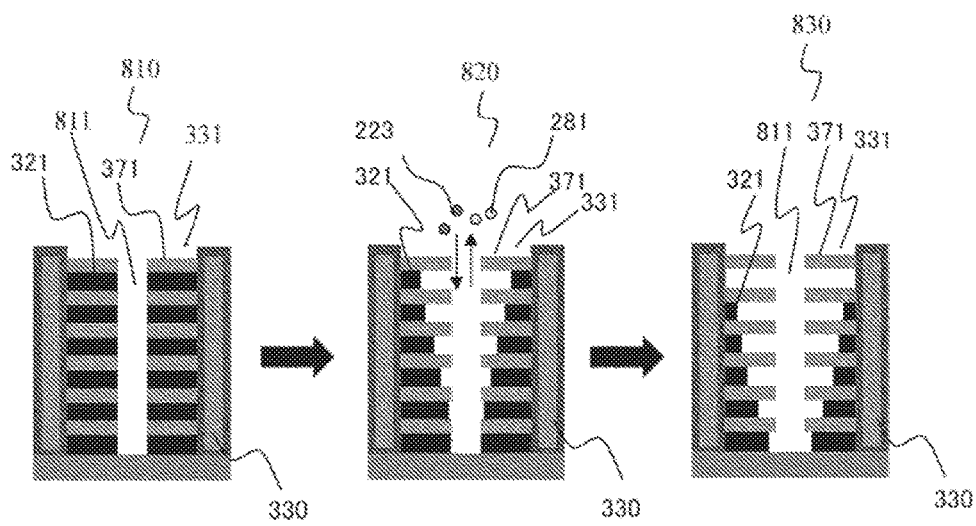
FIG. 8 is a sectional view of a wafer per process illustrating an example of the treatment procedure when a multilayered structure body including the tungsten film is processed using a plasma etching method of the related art.

FIG. 7 is a graph illustrating a change, with respect to the heating time, of a peak intensity 701 (which is equivalent to the peak 402 in FIG. 4) of 687±2 eV that is caused by the surface reaction layer 324, in a case where the surface reaction layer 324 is removed by performing the lamp heating such that attainment temperature of the surface of the wafer 318 becomes 50° C.

It is understood that the irradiation with the infrared ray 125 is performed by the infrared lamp 105, and the surface of the wafer 318 is heated, thereby, the peak intensity of 687±2 eV indicating a residual amount of the surface reaction layer 324 is reduced, and fully disappears for the heating time of 6 seconds.

In the heating process, since only the surface reaction layer 324 which is formed on the surface of the wafer 318 is volatilized, and the unreacted tungsten film 327 which is present in a lower portion of the surface reaction layer 324 is not changed at all, it is possible to remove only the surface reaction layer 324 portion. Accordingly, the second process (S103) of removing the surface reaction layer 324 has the self-limiting nature, in addition to the first process (S102) of forming the surface reaction layer 324.

At the time of the heating process, the wafer 318 is in the state of being placed on the wafer stage 102, but the supply of the helium gas which is used in order to enhance thermal conduction of the rear surface of the wafer 318 is stopped, and the temperature of the surface of the wafer 318 quickly rises.

In the first embodiment, the wafer 318 is treated in the state of being placed on the wafer stage 102 as it is, but the wafer 318 may be irradiated with the infrared ray in a state where the wafer 318 is not in contact thermally with the wafer stage 102 using a lift pin or the like. After the heating time which is demanded for removing the surface reaction layer 324 is elapsed, the infrared lamp 105 is turned off, and the remaining gas of the treatment chamber 101 is exhausted using the vacuum pump 108.

Thereafter, the supply of the helium gas which is not illustrated in the drawing is resumed to enhance the thermal conduction between the wafer 318 and the wafer stage 102, the temperature of the wafer 318 is cooled up to −20° C. by the circulator 116 and the cooling line 117, and the treatment of the first cycle is finished.

As described above, a fixed amount of the surface of the tungsten film 321 is etched and removed, by the first process of forming the surface reaction layer 324 by supplying the reactive species 223 including the radical of fluorine to the inside of the treatment chamber 101, and the second process of volatilizing and removing the surface reaction layer 324 by the heating. In the first embodiment, the etching amount of the surface of the tungsten film 321 in one cycle is 0.8 nm. Therefore, in the first embodiment in which the etching of 8 nm is demanded, the cycle described above is repeated ten times, and the etching is finished.

According to the etching technology of the first embodiment, since both the first process of forming the surface reaction layer 324 and the second process of removing the surface reaction layer 324 have the self-limiting properties, the etching amount of the surface of the tungsten film 321 at the time of finishing one cycle becomes fixed, regardless of the position in the in-plane direction of the wafer 318 and the depth direction. Therefore, even in a case where radical density is changed depending on the position on the wafer 318 or the position in the depth direction, the etching amount is not more than necessary, or does not become a lack, and it is possible to make the etching amount uniform.

The total etching amount is determined by the number of times of repeating the cycle, and becomes an integral multiple of the etching amount per cycle. As a result, in the etching technology of the first embodiment, it is possible to greatly improve a yield relating to the processing dimension controllability of the etching amount, in comparison with the etching by the continuous plasma treatment of the related art.

As described above, according to the first embodiment, it is possible to provide the technology (isotropic atomic layer level etching technology of tungsten) of etching and processing tungsten with high uniformity in the wafer in-plane direction and the pattern depth direction, and high processing dimension controllability in the atomic layer level.

Second Embodiment

A second embodiment of the invention will be described with reference to FIG. 8, and FIGS. 10 to 12. It is possible to apply an item, which is written in the first embodiment, and is not written in the second embodiment, to the second embodiment unless there are special circumstances. In the second embodiment, an example in which the tungsten film on the silicon wafer is selectively etched with respect to the silicon layer or the like using $CHF_3/O_2$ plasma will be described.

Figure 10:
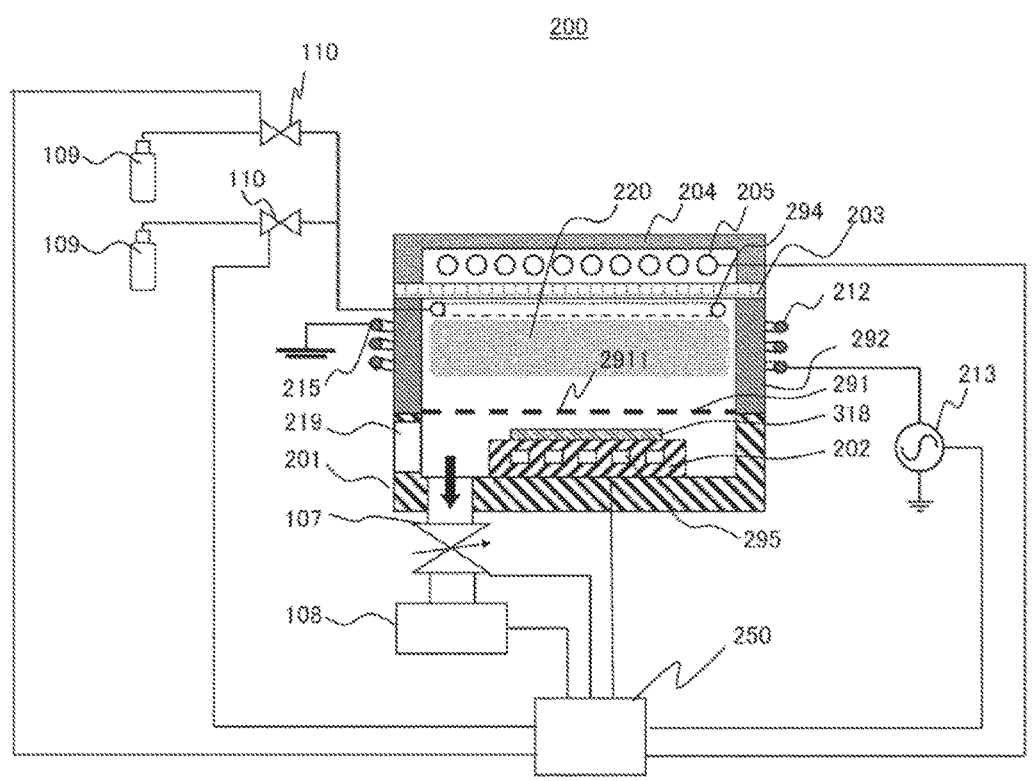
FIG. 10 is a sectional view illustrating a schematic configuration of an etching apparatus according to the second embodiment of the invention.

FIG. 10 is a sectional view of a schematic configuration of an etching apparatus 200 according to the second embodiment. The etching apparatus 200 includes a wafer stage 202 that is disposed on the inside of an approximately cylinder-shaped treatment chamber 201, an approximately cylinder-shaped plasma generation chamber 292 that is disposed continuously with the treatment chamber 201 by interposing a porous plate 291 which is made of quartz therebetween, a coil-shaped antenna 212 that is disposed on the outside of the plasma generation chamber 292, a lamp unit 204 that is disposed in the upper portion of the plasma generation chamber 292 by interposing a quartz glass 203 therebetween, an infrared lamp 205 that is disposed on the inside of the lamp unit 204, and a controller 250 that controls the whole.

The treatment chamber 201, the porous plate 291, the plasma generation chamber 292, the quartz glass 203, and the lamp unit 204 are configured to have the airtight structure by the vacuum sealing unit such as the O ring which is not illustrated in the drawing, and the air thereof is exhausted by the vacuum pump 108 which is connected through the variable conductance valve 107. The variable conductance valve 107 and the vacuum pump 108 are controlled by the controller 250.

The etching apparatus 200 is provided with the gas supply unit that is configured with the gas cylinder 109, the valve 110, and the like, and the gas supply unit is controlled by the controller 250. The gas which is supplied from the gas cylinder 109 is introduced into the inside of the plasma generation chamber 292 from a donut-shaped gas rectifier 294 through the valve 110. The introduced gas is activated by a plasma 220 that is generated by the high frequency electric power which is assigned to the coil-shaped antenna 212 from a high frequency power source 213 which is controlled by the controller 250, thereby, the radical is generated.

The generated radical diffuses into the plasma generation chamber 292, and passes through a hole 2911 of the porous plate 291, thereby, the generated radical is supplied to the treatment chamber 201, and reaches the surface of the wafer 318. The wafer stage 202 includes a thermoelectric module 295 that is controlled by the controller 250, and it is possible to cool the temperature of the wafer 318 by radiating the heat to a heat exchanger which is not illustrated in the drawing.

The material of the plasma generation chamber 292 is desirably a material which is high in plasma tolerance, is small in dielectric loss, and is less likely to be the foreign material or the cause of the contamination. For example, a melting quartz, an alumina sintered body of high purity, or an yttria sintered body is desirable.

The material of the treatment chamber 201 is desirably a metal which is excellent in plasma tolerance, and is less likely to generate the heavy metal contamination or the contamination due to the foreign material in the wafer. For example, aluminum or the like of which the anodizing treatment is performed onto the surface is desirable. It is possible to retain the pressure of the treatment chamber 201 to be fixed, by the variable conductance valve 107 and the vacuum pump 108 which are controlled by the controller 250, in a state where the raw gas of a desired flow rate flows.

The material of the wafer stage 202 described above is desirably aluminum or the like of which the anodizing treatment is performed onto the surface. The wafer stage 202 includes a lift pin for a rise and a fall of the wafer, which is not illustrated in the drawing.

In the upper portion of the treatment chamber 201 described above, there is provided the quartz glass 203 that is mounted to retain the airtight stage with the plasma generation chamber 292 by the vacuum sealing unit such as the O ring which is not illustrated in the drawing. It is desirable to use the material of which the transmittance of the light is high as a quartz glass 203. For example, it is desirable to use the ultra-high purity melting quartz glass or the like which is melted by oxyhydrogen flame, using the raw material of high purity.

The donut-shaped gas rectifier 294 as a rectification unit is disposed in the plasma generation chamber 292, and it is possible to supply the gas which is supplied from the gas supply unit, to the upper portion of the plasma generation chamber 292. The shape of the gas rectifier 294 is appropriately selected for the purpose of changing the supply form of the radical to the treatment chamber 201.

For example, if a shower plate in which a plurality of small holes for causing the gas to pass through are disposed in a disk-shaped plate is used, it is possible to introduce the radical into the treatment chamber 201 with excellent uniformity. At that time, as a material of the gas rectifier 294, it is desirable to use the material which is high in plasma tolerance, and is high in transmittance of the light, that is, the ultra-high purity melting quartz glass or the like.

In the upper portion of the quartz glass 203, there is provided the lamp unit 204 including the infrared lamp 205 for heating the wafer. The ON-OFF of the infrared lamp 205 is controlled by the controller 250. As an infrared lamp 205, it is possible to use a halogen lamp or the like. The frequency of the high frequency power source 213 which is connected to the coil-shaped antenna 212 is appropriately selected between 400 kHz and 40 MHz, but 27.12 MHz is used in the second embodiment.

The high frequency power source 213 has the frequency matching function which is not illustrated in the drawing. That is, the high frequency power source 213 has the functions that is capable of changing the output frequency in the range which is from ±5% to ±10% with respect to the center frequency of 27.12 MHz, and is capable of feedback controlling the frequency such that the ratio $P_r/P_f$ of the free-travelling wave electric power $P_f$ and the reflected wave electric power $P_r$ which are monitored in the output portion of the high frequency power source 213 becomes small.

As a sort of the gas which is supplied to the plasma generation chamber 292, the combination of the gases containing fluorine, oxygen, and hydrogen is used, in order to selectively etch the tungsten film with respect to the silicon layer or the like.

As an example of the gas containing fluorine, HF, $CF_4$, $CHF_3$, $CH_2F_2$, $CH_3F$, $C_2F_6$, $C_4F_8$, $NF_3$, $SF_6$, or the like may be used. As an example of the gas containing oxygen, $O_2$, CO, $CO_2$, $SO_2$, or the like may be used. As an example of the gas containing hydrogen, HF, $H_2$, $CH_4$, $CHF_3$, $CH_2F_2$, $CH_3F$, or the like may be used.

In a case where the gas in which a plurality of chemical elements among fluorine, oxygen, and hydrogen are included in one molecule is used, it is possible to reduce the number of gases to be mixed. It is possible to appropriately dilute the mixed gas by adding an inert gas such as Ar or He thereto.

In the second embodiment, the gas including oxygen and hydrogen in addition to fluorine, is used in order to secure selectivity with silicon or the like. If the gas including oxygen is used, in a case where silicon or the like is exposed on the surface of a treated body, this is because the surface thereof is oxidized, and the etching does not progress, thereby, high selectivity is obtained. Since hydrogen is included at the same time, the oxidation of the tungsten surface is fully prevented on tungsten, and the progression of the cycle etching process is not hindered by the generation and the desorption of the tungsten hexafluoride. One effect of a case where oxygen is included in the gas, is that the supply amount of the fluorine radical increases by oxidizing $CHF_3$ with oxygen, and the generation of the tungsten hexafluoride is promoted.

As an example of the specific combination of the gases, $CF_4/H_2/O_2$, $CHF_3/O_2$, $CH_2F_2/O_2$, $CH_2F_2/CO_2$, $CH_3F/O_2$, $C_2F_6/H_2/CO_2$, $C_2F_6/CH_4/CO$, $CF_4/H_2/CO_2$, or the like may be used, and is appropriately selected as a mixed gas, in accordance with the selectivity which is demanded in each process. In the second embodiment, the plasma of $CHF_3/O_2$ is used from the viewpoint of obtaining high selectivity with respect to silicon and silicon dioxide, but the gases of other sorts may be used.

In the etching of the tungsten film according to the second embodiment, the radical including fluorine, oxygen, and hydrogen is supplied to the silicon wafer on which the tungsten film is formed, and is adsorbed onto the tungsten film, and the etching progresses by repeating the first process of forming the surface reaction layer by performing the chemical reaction, and the second process of volatilizing the surface reaction layer which is generated due to the chemical reaction by the heating.

Figure 9:
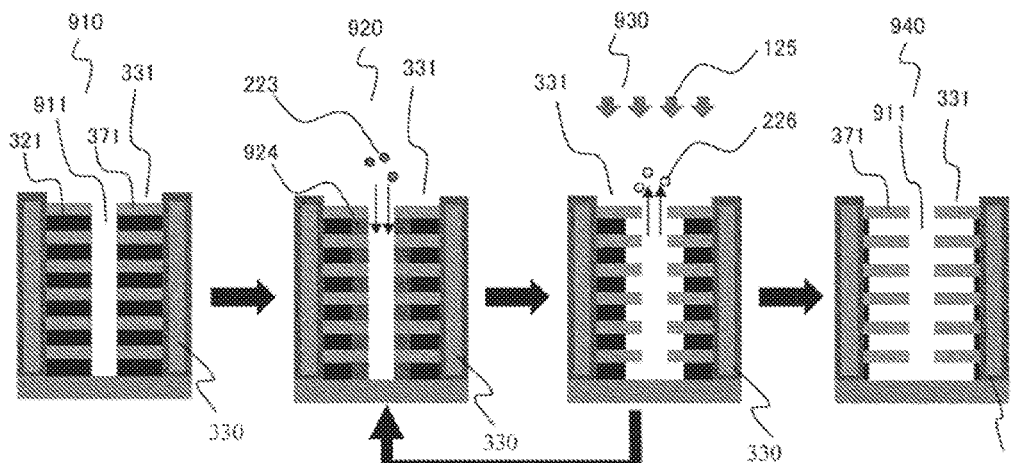
FIG. 9 is a sectional view of the wafer per process illustrating an example of the treatment procedure when the multilayered structure body including the tungsten film is processed using an etching method according to a second embodiment of the invention.

FIG. 9 is a schematic diagram illustrating a change of a wafer sectional structure (multilayered structure body including the tungsten film) in a case where the etching technology according to the second embodiment is used. Since a wafer sectional structure 910 (step S201) before the etching is the same as the structure of the wafer cross section 810 described in FIG. 8, the description thereof will be omitted. In the second embodiment, only the tungsten film 321 is selectively etched, transversely with respect to the silicon dioxide film 371 on the inside of the groove pattern 331 of the high aspect ratio in which the tungsten film 321 and the silicon dioxide film 371 are alternately stacked (steps S201 to S204).

As illustrated in steps S202 and S203 of FIG. 9, in a case where the etching technology according to the second embodiment is used, since the generation amount of a surface reaction layer 924 (which is equivalent to the surface reaction layer 324 in the first embodiment) has the self-limiting nature as described in the first embodiment, the etching amount at a point of time at which one cycle that is obtained by combining the first process (step S202) as illustrated in a wafer sectional structure 920 and the second process (step S203) as illustrated in a wafer sectional structure 930 is finished, becomes a fixed value regardless of the position in the pattern depth direction (step S203). Therefore, the etching amount after one cycle which is obtained by combining the first process and the second process is repeated a plurality of times, is also substantially fixed regardless of the pattern depth direction, and it is possible to obtain the uniform distribution of the etching amount as illustrated in a wafer sectional structure 940 (step S204).

Specifically, first, the wafer 318 on which the tungsten film to be etched is formed, is carried in by the wafer transport apparatus which is not illustrated in the drawing from a wafer transport port 219, and is placed on the wafer stage 202 (step S201 in FIG. 9). At this time, the temperature of the wafer stage 202 is cooled to −10° C. by the thermoelectric module 295 which is controlled by the controller 250, and the wafer temperature is cooled to −10° C. Thereafter, the air of the treatment chamber 201 is exhausted through the variable conductance valve 107 by the vacuum pump 108 which is controlled by the controller 250, in a state where the wafer transport port 219 is closed by the door which is not illustrated in the drawing and the treatment chamber 201 is airtightly maintained (see FIG. 10).

On the other hand, the $CHF_3$ gas and the $O_2$ gas are supplied through the valve 110 or the like from the gas cylinder 109, the high frequency electric power from the high frequency power source 213 which is controlled by the controller 250 is supplied to the coil-shaped antenna 212, and the plasma 220 is formed. At this time, the flow rate of the $CHF_3$ gas is 50 sccm, and the flow rate of the $O_2$ gas is 50 sccm. The source gas becomes the reactive species including the radical, which is activated by the plasma 220, and flows into the treatment chamber 201 by passing through the porous plate 291. The reactive species including the radical, which flows into the treatment chamber 201, uniformly diffuses into the whole of the treatment chamber 201, and is adsorbed onto the entire surface of the wafer 318 which is placed on the wafer stage 202 (see FIG. 10).

The reactive species 223 which is adsorbed onto the wafer 318 reacts with the tungsten film 321 on the surface of the wafer 318, and the surface reaction layer 924 of which the main ingredient is the tungsten hexafluoride is formed as a reaction product on the surface of the tungsten film 321. Due to the effect that the porous plate 291 is disposed between the wafer 318 and the plasma 220, ions which are generated in the plasma are hardly injected into the wafer 318. Accordingly, the non-selective etching due to ion injection is hardly generated. In particular, the etching of the silicon dioxide film 371 of which the ion injection is demanded for the etching hardly progresses.

After the treatment time which is set in order to form the surface reaction layer 924 in a self-limiting manner is elapsed, the control is performed by the controller 250, thereby, the supply of the source gas by the valve 110 is stopped, and the high frequency power source 213 is stopped. The gas remaining in the treatment chamber 201 is exhausted by the variable conductance valve 107 and the vacuum pump 108.

Subsequently, the control is performed by the controller 250, thereby, the infrared lamp 205 is turned on, and the surface of the wafer 318 is heated in a vacuum by the infrared ray 125 (see FIG. 10 and step S203 in FIG. 9). At this time, the degree of vacuum is 0.1 Pa. The irradiation time of the infrared ray 125 is 7 seconds, and the maximum attainment temperature of the wafer surface is 80° C. As a result, the surface reaction layer of which the main ingredient is the tungsten hexafluoride is volatilized from the surface of the wafer 318, and is removed.

After the treatment time which is set in order to remove the reaction product of the surface is elapsed, the control is performed by the controller 250, thereby, the infrared lamp 205 is turned off, and the remaining gas of the treatment chamber 201 is exhausted using the vacuum pump 108.

As described above, the surface portion of the tungsten film is etched and removed, by performing the combination of the first process (step S202 in FIG. 9) of forming the surface reaction layer by adsorbing the reactive species including the radical, and the second process (step S203 in FIG. 9) of removing the surface reaction layer by the wafer heating. The first process and the second process are repeatedly performed in a cycle manner, thereby, it is possible to perform the etching of the demanded amount with high controllability (see step S204 in FIG. 9).

In the second embodiment, the base material temperature is set to be −10° C. when the surface reaction layer is formed by performing the irradiation of the radical on the tungsten surface, but there is a need that the base material temperature at the time of the radical irradiation is set to be a sufficiently low temperature such that the surface reaction layer is not removed. Preferably, there is a need that the base material temperature is set to be 2° C. or lower, which is lower than the melting point temperature of the tungsten hexafluoride.

Figure 11:
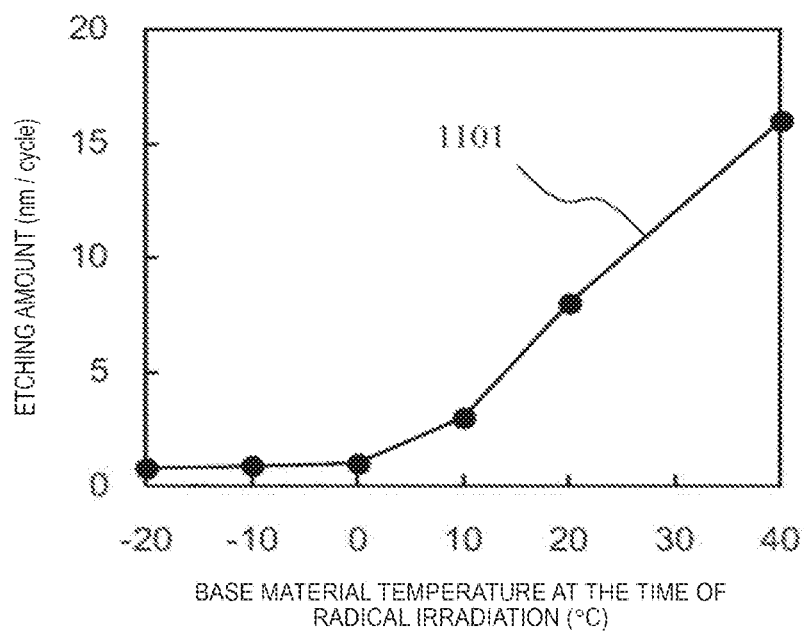
FIG. 11 is a graph illustrating dependency of an etching amount per cycle, with respect to a base material temperature in a radical irradiation process, when the etching method according to the second embodiment of the invention is used.

FIG. 11 illustrates a dependency 1101 of the tungsten etching amount per cycle, with respect to the base material temperature at the radical irradiation. It is understood that in a case where the base material temperature at the radical irradiation is in the range which is from −20° C. to 0° C., the etching amount per cycle is approximately 1 nm, and is substantially fixed, but in a case where the base material temperature is 10° C. or higher, the etching amount per cycle increases. As understood from the result, in order to form the surface reaction layer in a self-limiting manner and advance the cycle etching with controllability in the atomic layer level, it is desirable to set the base material temperature at the time of the radical irradiation to be 2° C. or lower, which is lower than the melting point temperature of the tungsten hexafluoride. If the base material temperature at the time of the radical irradiation becomes the further low temperature which is −40° C. or lower, it is assumed that reaction speeds of fluorine and tungsten are greatly lowered, thereby, the tungsten hexafluoride is less likely to be generated. Therefore, the temperature range which is suitable for the quick generation of the surface reaction layer is −40° C. to 2° C.

Figure 12:
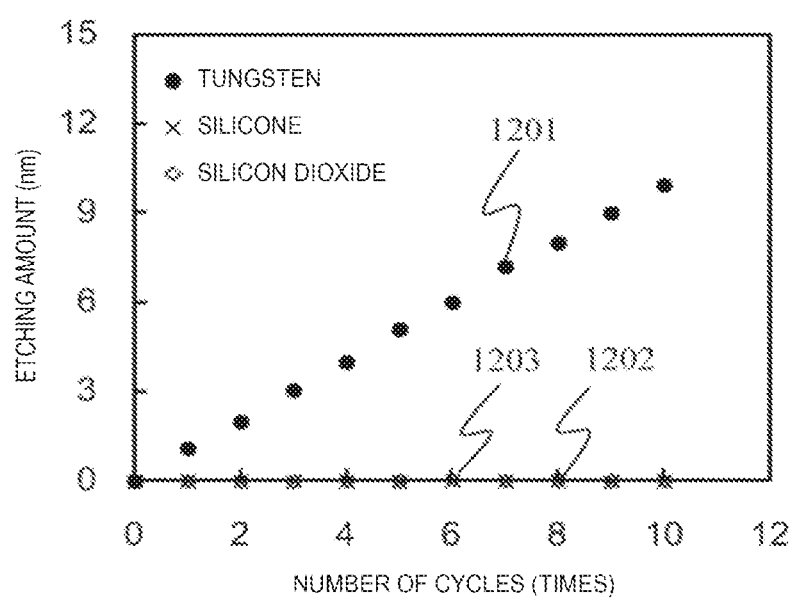
FIG. 12 is a graph illustrating dependency of the number of cycles of the etching amount when the etching method according to the second embodiment of the invention is used.

FIG. 12 illustrates the dependency of the number of cycles of the etching amount in various films such as a tungsten film 1201, a silicon layer 1202, and a silicon dioxide film 1203, in a case where the etching is performed using the cycle treatment according to the second embodiment. In order to measure the etching amount of the tungsten film 1201, a fluorescent X-ray film thickness measuring apparatus is used. In order to measure the etching amounts of the silicon layer 1202 and the silicon dioxide film 1203, a spectroscopic ellipsometer is used. The etching amount of the tungsten film 1201 gradually increases in proportion to the number of cycles, and the etching amount per cycle is 1.0 nm. In the second embodiment, since the etching of 5 nm in total is demanded, it is possible to obtain the target etching amount with high accuracy, by repeating the cycle described above five times.

Since it is possible to control the etching amount per cycle by changing the base material temperature of a reaction process or the sort of the used gas, it is possible to adjust the etching amount in accordance with the processing dimension which is demanded. In the second embodiment, $CHF_3/O_2$ is used as a gas including fluorine, oxygen, and hydrogen, but it is understood that the silicon layer 1202 and the silicon dioxide film 1203 are not etched by using the gases. Thereby, it is possible to etch the tungsten film 1201 with high selectivity, with respect to the silicon layer 1202 and the silicon dioxide film 1203.

In the process of the second embodiment, since oxygen is included in the reactive species, the silicon surface is oxidized, thereby, it is possible to further prevent the progression of the etching reaction on the silicon surface. Due to the effects, if the gas chemistry and the cycle procedure of the second embodiment are used, it is possible to selectively etch only the tungsten film, even in a case where the silicon layer is exposed on the surface of the treated body. In the process of the second embodiment, due to the effect that hydrogen is included in the reactive species, the oxidation of the tungsten surface is prevented, thereby, it is possible to advance the cycle etching of tungsten.

As illustrated in FIG. 12, in a case where the cycle etching technology according to the second embodiment is used, the etching amounts of the silicon layer 1202 and the silicon dioxide film 1203 are measurement limits or less, and it is possible to etch only the tungsten film 1201, with selectivity which is 100 to 1 or more with respect to the silicon layer 1202 and the silicon dioxide film 1203.

As described above, according to the second embodiment, it is possible to obtain the same effect as that of the first embodiment. Oxygen and hydrogen are included in the supply gas when the surface reaction layer is formed on the tungsten film, thereby, it is possible to selectively etch the tungsten film with respect to the silicon layer. Due to the effect of a case where there is no ion irradiation, it is possible to selectively etch tungsten with respect to the silicon dioxide film.

In the second embodiment, an example in which the etching treatment of the wafer 318 is performed using the etching apparatus 200 illustrated in FIG. 10 is described, but even if the etching treatment is performed through the process that is from step S201 to step S204 as illustrated in FIG. 9 using the etching apparatus 100 which is described in the first embodiment, and is illustrated in FIG. 1, it is possible to obtain the same effect.

The present invention is not limited to the embodiments described above, but includes various modification examples. The configuration of the embodiments may be replaced with a configuration that is substantially the same as the configuration illustrated in the embodiments described above, a configuration that has the same effects, or a configuration that is capable of achieving the same object. For example, in the above description, the infrared lamp 105 is disposed on the outside of the plasma generation chamber 192 or 292, but may be disposed on the inside of the plasma generation chamber 192 or 292. The embodiments described above are described in detail in order to easily understand the invention, and are not necessarily limited to the embodiments including all of the configurations described.

What is claimed is:

1. An etching method of etching a tungsten film which is formed on at least a portion of a surface of a base material, the method comprising:
generating a surface reaction layer of the tungsten film on a surface of the tungsten film by supplying a reactive species including fluorine which is generated in plasma onto the surface of the tungsten film for a first predetermined time in a state in which the base material and the tungsten film are maintained at a temperature that is lower than a melting point temperature of a tungsten fluoride; and
removing the surface reaction layer that is generated on the surface of the tungsten film by heating the surface reaction layer to a boiling point temperature or higher of the tungsten fluoride for a second predetermined time.

2. The etching method according to claim 1,
wherein a plurality of cycles are repeated using a combination of the generating and the removing as one cycle.

3. The etching method according to claim 1,
wherein the surface reaction layer mainly contains tungsten which is bonded with fluorine.

4. The etching method according to claim 1,
wherein the surface reaction layer is a tungsten hexafluoride.

5. The etching method according to claim 1,
wherein the reactive species is generated by plasma of a raw gas including a substance of which an ingredient is fluorine, and a substance of which an ingredient is oxygen or sulfur.

6. The etching method according to claim 1,
wherein the reactive species is generated by plasma of a raw gas including a substance of which an ingredient is fluorine, a substance of which an ingredient is oxygen or sulfur, and a substance of which an ingredient is hydrogen.

7. The etching method according to claim 1,
wherein a base material temperature in the generating is 2° C. or lower.

8. The etching method according to claim 1,
wherein a heating temperature in the removing is 17° C. or higher.

9. The etching method according to claim 1,
wherein a degree of vacuum at the time of heating in the removing is 100 Pa or less.

10. The etching method according to claim 1,
wherein a generation amount of the surface reaction layer has saturability with respect to treatment time of the generating.

11. An etching method of etching a tungsten film which is formed on a surface of a base material, the method comprising:
generating a tungsten hexafluoride layer on a surface of the tungsten film by supplying a reactive species including fluorine that is generated in plasma to the surface of the tungsten film, the tungsten hexafluoride layer having a self-limiting nature; and
removing the tungsten hexafluoride layer by heating a surface of the tungsten hexafluoride layer to a boiling point temperature or higher of the tungsten hexafluoride layer.

12. The etching method according to claim 11,
wherein in the generating, the tungsten hexafluoride layer is formed on the surface of the tungsten film, by supplying the reactive species including fluorine which is generated in the plasma onto the surface of the tungsten film for a first predetermined time in a state in which the base material and the tungsten film are maintained lower than melting point temperature of the tungsten hexafluoride layer.

13. An etching apparatus which etches a tungsten film, comprising:
a treatment chamber;
a stage unit which is disposed in an inside of the treatment chamber and on which a treated body is placed;
a cooling unit for cooling the stage unit;
a gas supply unit that supplies a gas including fluorine to the inside of the treatment chamber;
a plasma source that excites the gas supplied from the gas supply unit to generate plasma, and supplies a radical including fluorine to the inside of the treatment chamber;
a vacuum exhaust system that evacuates gas from the inside of the treatment chamber;
a heating unit that heats the treated body placed on the stage unit; and
a controller that controls the cooling unit, the gas supply unit, the plasma source, the vacuum exhaust system, and the heating unit,
wherein the controller executes first treatment in a first predetermined time in which a surface reaction layer of the tungsten film is generated on a surface of the tungsten film by supplying the gas including the fluorine to the plasma source from the gas supply unit, exciting the supplied gas to generate the plasma, and supplying the radical including the fluorine to the inside of the treatment chamber, in a state in which the stage unit is cooled by the cooling unit, by controlling the cooling unit, the gas supply unit, and the plasma source, and a second predetermined time in which the surface reaction layer that is generated on the surface of the tungsten film in the first treatment is heated by the heating unit and removed while the air of the inside of the treatment chamber is evacuated by the vacuum exhaust system, by controlling the vacuum exhaust system and the heating unit.

14. The etching apparatus according to claim 13,
wherein the heating unit for heating the treated body is an infrared lamp.

15. The etching apparatus according to claim 13,
wherein the controller cools the stage unit to a melting point temperature or lower of the surface reaction layer which is generated on the surface of the treated body, by controlling the cooling unit.

16. The etching apparatus according to claim 13,
wherein the controller heats the surface of the treated body to a boiling point temperature or higher of the surface reaction layer which is formed on the treated body for the second predetermined time, by controlling the heating unit.

17. The etching apparatus according to claim 13,
wherein the controller sequentially repeats and executes a plurality of times of cooling the stage unit to the melting point temperature or lower of the surface reaction layer which is generated on the surface of the treated body, by controlling the cooling unit, and heating the surface of the treated body to the boiling point temperature or higher of the surface reaction layer which is formed on the treated body for the second predetermined time, by controlling the heating unit.

* * * * *